United States Patent
Ghoshal et al.

(10) Patent No.: US 7,019,386 B2
(45) Date of Patent: Mar. 28, 2006

(54) SILOXANE EPOXY POLYMERS FOR LOW-K DIELECTRIC APPLICATIONS

(75) Inventors: Ramkrishna Ghoshal, Clifton Park, NY (US); Pei-I Wang, Troy, NY (US); Toh-Ming Lu, Loudonville, NY (US); Shyam P. Murarka, Clifton Park, NY (US)

(73) Assignees: Polyset Company, Inc., Mechanicville, NY (US); Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 10/832,515

(22) Filed: Apr. 27, 2004

(65) Prior Publication Data

US 2005/0236695 A1    Oct. 27, 2005

(51) Int. Cl.
*H01L 23/58* (2006.01)
(52) U.S. Cl. .................................. 257/642; 257/632
(58) Field of Classification Search ............. 257/642, 257/632, 635, 410, 767
See application file for complete search history.

(56) References Cited

U.S. PATENT DOCUMENTS

| | | | |
|---|---|---|---|
| 5,527,741 A * | 6/1996 | Cole et al. | ............ 438/107 |
| 2002/0137870 A1 | 9/2002 | Crivello | |

FOREIGN PATENT DOCUMENTS

| | | |
|---|---|---|
| JP | 2001 131517 A1 | 5/2001 |
| WO | WO 01/53385 A1 | 7/2001 |
| WO | WO 2004/034104 A1 | 4/2004 |

OTHER PUBLICATIONS

Wang, et al., "Novel Epoxy Siloxane Polymer as Low-K Dielectric", *Mat. Res. Soc. Symp. Proc.,* 812, F4.4.1-F4.4.6 (2004).

* cited by examiner

*Primary Examiner*—Sara Crane
(74) *Attorney, Agent, or Firm*—Heslin Rothenberg Farley & Mesiti, P.C.; Martha L. Boden, Esq.

(57) ABSTRACT

Semiconductor devices employing siloxane epoxy polymers as low-κ dielectric films are disclosed. The devices include a semiconductor substrate, one or more metal layers or structures and one or more dielectric films, wherein at least one dielectric film in the devices is a siloxane epoxy polymer. Use of siloxane epoxy polymers is advantageous, in part, because the polymers adhere well to metals and have dielectric constants as low as 1.8. Thus, the disclosed semiconductor devices offer much better performance than devices fabricated using conventional dielectric materials. Furthermore, the siloxane epoxy polymer dielectrics are fully curable at low temperatures, exhibit low leakage currents, and remain stable at temperatures greater than 400° C. making them particularly attractive for use in the semiconductor industry

14 Claims, 6 Drawing Sheets

SILOXANE EPOXY POLYMERS FOR LOW-κ DIELECTRIC APPLICATIONS

CROSS-REFERENCE TO RELATED APPLICATIONS

This Application is related to the following copending U.S. Patent Applications:

U.S. patent application Ser. No. 10/832,629, filed Apr. 27, 2004, entitled "CHEMICAL TREATMENT OF MATERIAL SURFACES"; and U.S. patent application Ser. No. 10/832,844, filed Apr. 27, 2004, entitled "SILOXANE EPOXY POLYMERS AS METAL DIFFUSION BARRIERS TO REDUCE ELECTROMIGRATION".

Each of these Applications is hereby incorporated by reference herein in its entirety.

FIELD OF THE INVENTION

The present invention relates to dielectric materials employed in semiconductor devices, and more particularly to siloxane epoxy polymers useful as low-κ dielectric materials in such devices.

BACKGROUND OF THE INVENTION

The speed of semiconductor circuitry varies inversely with the resistance (R) and capacitance (C) of the interconnection system. The higher the value of the R times C product, the more limiting the circuit speed. With the continued shrinking of semiconductor devices, high resistance-capacitance (RC) delay has become a major hindrance to the further increase of the IC frequency. It has been found, however, that lowering the overall dielectric constants (κ values) of the dielectric layers employed in metal interconnects lowers the resistance capacitance (RC) of the chip and improves its performance. Thus, an essential need for low κ interlayer dielectric materials has developed. At the same time, thermal budget is of concern for the semiconductor industry leading to the requirement of low κ dielectric materials that can be processed at low temperatures. In addition, high temperature stability in excess of 400° C. of processed dielectric films is necessary to ensure circuit reliability.

Currently available low κ polymeric dielectric materials require high processing temperatures of >350° C., and are thus not best suited to meet the needs of the semiconductor industry. For example, Dow Chemical Company's SiLK™, which is an aromatic hydrocarbon polymer containing phenylene and carbonyl groups in the main chain, requires a drying step at 320° C. to remove solvent, and a final curing step at a temperature of about 400° C.

For these reasons, an essential need exists in the semiconductor industry for low-κ dielectric materials that can be fully processed at low temperatures but that remain stable at high temperatures.

SUMMARY OF THE INVENTION

The present invention meets the aforementioned needs and unexpectedly provides for semiconductor devices that utilize new low-κ dielectric polymeric materials therein, particularly as interlayer dielectrics between metallization levels. In particular, the siloxane epoxy polymers described herein have dielectric constants (κ values) lower than 3, and as low as 1.8 under certain processing conditions. Thus the devices utilizing such materials can provide much better performance than devices fabricated using conventional dielectric materials, such as $SiO_2$, for example. Advantageously, the siloxane epoxy polymer materials can be fully cured at temperatures as low as 155° C., while retaining their stability and dielectric properties at high semiconductor device processing temperatures greater than 400° C.

Therefore, the present invention relates to semiconductor devices comprising a semiconductor substrate, one or more metal layers or structures located on the substrate, and one or more dielectric films, wherein at least one dielectric film comprises a siloxane epoxy polymer.

DETAILED DESCRIPTION OF THE INVENTION

The present invention relates to the use of siloxane epoxy polymers as low-κ dielectric materials in semiconductor devices. The polymers exhibit good adhesion with metals, such as copper, and have dielectric constants as low as 1.8 for certain processing conditions. The polymers show excellent reliability with respect to their dielectric properties when subjected to standard test conditions of thermal and electrical bias. Furthermore, the low-κ dielectric polymers described herein require low processing temperatures, exhibit low leakage currents, and remain stable at temperatures greater than 400° C. making them particularly attractive for use in the semiconductor industry.

As used herein, the term "low-κ" material means a material having a dielectric constant less than 3.9, based upon a value of the dielectric constant of a vacuum as one (1).

The semiconductor device of the present invention comprises a semiconductor substrate, one or more metal layers or structures on the substrate and one or more dielectric films, wherein at least one dielectric film comprises a siloxane epoxy polymer. Furthermore, it should be noted that a typical integrated circuit structure may have eight or more interconnect (metal) layers stacked on top of each other. Interposed between each metal layer is a dielectric layer. Accordingly, the present invention also embraces these multilevel structures wherein at least one siloxane epoxy polymer dielectric layer is used to separate adjacent metal interconnect layers.

As used herein, the term "semiconductor substrate" refers to substrates known to be useful in semiconductor devices, i.e. intended for use in the manufacture of semiconductor components, including, but not limited to, focal plane arrays, opto-electronic devices, photovoltaic cells, optical devices, transistor-like devices, 3-D devices, silicon-on-insulator devices, super lattice devices and the like. Semiconductor substrates include integrated circuits preferably in the wafer stage having one or more layers of wiring, as well as integrated circuits before the application of any metal wiring. Furthermore, a semiconductor substrate can be as simple as the basic wafer used to prepare semiconductor devices. The most common such substrates used at this time are silicon and gallium arsenide.

The low-κ siloxane epoxy polymer films described herein may be applied to a plain wafer prior to the application of any metallization. Alternatively, they may be applied over a metal layer, or over an oxide or nitride layer or the like as an interlayer dielectric, or as a top passivation coating to complete the formation of an integrated circuit.

Exemplary low-κ siloxane epoxy polymers suitable for use in the semiconductor devices of the present invention include those commercially available from Polyset Company as PC 2000, PC 2003, PC 2000HV, each of which has the following formula (I)

wherein m is an integer from 5 to 50. The molecular weights of these polymers range from about 1000 to about 10,000 g/mole.

Other suitable siloxane epoxy polymers for use as low-κ dielectric materials include random and block copolymers having the following general following formula (II):

wherein the X monomer units and Y monomer units may be randomly distributed in the polymer chain. Alternatively, like repeating units, X and Y, respectively, may occur together in a block structure. The polymers of formula (II) are advantageous because they have unexpectedly low dielectric constants of less than 3.

Preferably, in formula (II), $R^1$ and $R^2$ are each independently methyl, methoxy, ethyl, ethoxy, propyl, butyl, pentyl, octyl, and phenyl, and $R^3$ is methyl or ethyl. In addition, p is an integer ranging from 2 to 50; and q is 0 or an integer ranging from 1 to 50. Most preferably, $R^3$ in the terminal residues at the end of the polymer chain is methyl, resulting in a polymer having formula (IIA).

Exemplary polymers having formula (IIA) include, but are not limited to, Polyset's PC 2010, PC 2021, PC 2026, and PC 2031. In PC 2010, $R^1$ and $R^2$ in formula (IIA) are both phenyl groups, and the ratio of p to q ranges from about 8:1 to about 1:1, but is usually about 4:1 to about 2:1. The molecular weight of PC 2010 ranges from about 5000 to about 7500 g/mole. In PC 2021, $R^1$ and $R^2$ are both methyl groups, as shown in formula (IIB), and the ratio of p to q ranges from about 8:1 to about 1:1, but is usually about 4:1 to about 2:1. The molecular weight of PC 2021 ranges from about 2000 to about 7500 g/mole. In PC 2026, $R^1$ is trifluoropropyl, and $R^2$ is a methyl group. The ratio of p:q is typically about 3:1. The molecular weight of PC 2026 ranges from about 5000 to about 7500 g/mole. In PC 2031, $R^1$ is a methyl group, and $R^2$ is a propyl group, and the ratio of p to q ranges from about 8:1 to about 1:1, but is usually about 4:1 to about 2:1. The molecular weight of PC 2031 ranges from about 2000 to about 7500 g/mole.

Siloxane epoxy polymers of formula (II) containing monomer units X and Y may be synthesized by base-catalyzed hydrolysis and subsequent condensation of alkoxy silane monomers, using 0.5 to 2.5 equivalents of water in the presence of an ion exchange resin, such as Amberlyst A-26, Amberlite IRA-400 and Amberlite IRA-904 from Rohm & Haas, in the presence of an alcohol solvent, followed by separation of the siloxane oligomer from the water/solvent mixture. The procedure for the polymerization is described fully in U.S. Pat. Nos. 6,069,259 and 6,391,999 and copending, commonly assigned U.S. application Ser. No. 10/269,246 filed Oct. 11, 2002.

In formula (II), the alkoxy silane monomer from which the X units are derived may be 2-(3,4-epoxycyclohexylethyl)trimethoxy silane, which is commercially available as A-186 from Witco Corporation. Exemplary monomers used to provide the Y units include tetraethoxysilane (ethylorthosilicate), tetramethoxysilane (methylorthosilicate), tetraisopropoxysilane, methyltrimethoxysilane, ethyltriethoxysilane, hexyltriethoxysilane, cyclohexyltrimethoxysilane, 1,1,1-trifluoroethyltriethoxysilane, phenyltriethoxysilane, phenylmethyldiethoxysilane, phenylmethyldimethoxysilane, diphenyldimethoxysilane (used in PC 2010), 2-phenylethyltrimethoxysilane, benzyltriethoxysilane, vinyltrimethoxysilane, dimethyldimethoxysilane (used in PC 2021), methylpropyldimethoxysilane (used in PC 2031), dipropyldimethoxysilane, dibutyldimethoxysilane, methylpentyldimethoxysilane, dipentyldimethoxysilane, dioctyldimethoxysilane, dimethyldiethoxysilane, trimethylmethoxysilane, diethyldimethoxysilane, allyltrimethoxysilane, divinyldimethoxysilane, methylvinyldimethoxysilane, bis(triethoxysilyl)methane, bis(triethoxysilyl)ethane, butenyltrimethoxysilane, trifluoropropylmethyldimethoxysilane (used in PC 2026), 3-bromopropyltrimethoxysilane, 2-chloroethylmethyldimethoxysilane, 1,1,2,2-tetramethoxy-1,3-dimethyldisiloxane, phenyltrimethoxysilane. Also, useful in these mixtures are trimethoxysilyl-terminated polydimethylsiloxanes as well as the corresponding hydroxyl-terminated polydimethylsiloxanes. The foregoing monomers are either commercially available or readily synthesized by reactions well known in the art.

One preferred low-κ dielectric material for use in the present invention is the siloxane epoxy polymer having formula (IIB) above (PC 2021), which may be synthesized from 2-(3,4-epoxycyclohexylethyl)trimethoxy silane (A-186) (to form the X units), and dimethyldimethoxysilane (to form the Y units). Dimethyldimethoxysilane is commercially available from United Chemical Technology (UCT) or readily synthesized by reactions well known in the art. As previously mentioned, the ratio of p to q ranges from about 8:1 to about 1:1, but is usually about 4:1 to about 2:1. The polymer of formula (IIB) has a surprisingly low dielectric constant ranging from about 2.2 to about 2.7. Another preferred low-κ dielectric material for use in the present invention is the siloxane epoxy polymer having formula (IIA), wherein $R^1$ is methyl, and $R^2$ is propyl (PC 2031), which may be synthesized from 2-(3,4-epoxycyclohexylethyl)trimethoxy silane (A-186) (to form the X units), and methylpropyldimethoxysilane (to form the Y units). The ratio of p to q ranges from about 8:1 to about 1:1, but is usually about 4:1 to about 2:1. Furthermore, a dielectric constant as low as 1.8 has been measured for PC 2031. Other exemplary suitable polymers include those having formula (IIA), wherein $R^1$ and $R^2$ are both propyl groups (synthesized from 2-(3,4-epoxycyclohexylethyl)trimethoxy silane (A-186) (to form the X units), and dipropyldimethoxysilane (to form the Y units). In another embodiment of formula (IIA), $R^1$ is methyl, and $R^2$ is pentyl (synthesized from 2-(3,4-epoxycyclohexylethyl)trimethoxy silane (A-186) (to form the X units), and methylpentyldimethoxysilane (to form the Y units)). In yet another embodiment of formula (IIA), $R^1$ and $R^2$ are both pentyl groups (synthesized from 2-(3,4-epoxycyclohexylethyl)trimethoxy silane (A-186) (to form the X units), and dipentyldimethoxysilane (to form the Y units). In each of these embodiments, the ratio of p to q ranges from about 8:1 to about 1:1, but is usually about 4:1 to about 2:1, and the molecular weight ranges from about 2000 to about 7500 g/mole.

Application of the siloxane epoxy polymer dielectric films is done by depositing a siloxane epoxy polymer described herein to a thickness ranging from about 0.02 μm to about 2 μm, but preferably from about 0.1 μm to about 0.7 μm by any known method, such as spin casting (also referred to herein as "spin coating"), dip coating, roller coating, or doctor blading, for example. Typically, spin casting is used.

After deposition, siloxane epoxy polymers having formula (I) or (II) may be cured by art-recognized techniques, such as thermally or by using actinic radiation, such as U.V. or electron beam. However, prior to curing, the polymers may be dried under vacuum to remove solvent for a time ranging from about 0.5 to about 2 hours, and a temperature ranging from about 80° C. to about 120° C., but typically about 1 hour at about 100° C.

Curing of the polymer is effected in the presence of a cationic polymerization initiator such as a diazonium, sulfonium, phosphonium, or iodonium salt, but more preferably a diaryliodonium, dialkylphenacylsulfonium, triarylsulfonium, or ferrocenium salt photoinitiator.

Preferred polymerization cationic initiators include diaryliodonium salts selected from the group having formulae (III), (IV), (V), (VI), and (VII)

wherein each $R^{11}$ is independently hydrogen, $C_1$ to $C_{20}$ alkyl, $C_1$ to $C_{20}$ alkoxyl, $C_1$ to $C_{20}$ hydroxyalkoxyl, halogen, and nitro; $R^{12}$ is $C_1$ to $C_{30}$ alkyl or $C_1$ to $C_{30}$ cycloalkyl; y and z are each independently integers having a value of at least 5; [A]⁻ is a non-nucleophilic anion, commonly $[BF_4]^-$, $[PF_6]^-$, $[AsF_6]^-$, $[SbF_6]^-$, $[B(C_6F_5)_4]^-$, or $[Ga(C_6F_5)_4]^-$. These diaryliodonium salt curing agents are described in U.S. Pat. Nos. 4,842,800, 5,015,675, 5,095,053, and 5,073,643, and 6,632,960.

Preferably, the cationic polymerization initiator is dissolved in 3,4-epoxycyclohexylmethyl-3',4'-epoxycyclohexane carboxylate, dicyclopentadiene dioxide, or bis(3,4-epoxycyclohexyl) adipate to form a catalyst solution which contains from about 20 to about 60 parts by weight of the selected cationic initiator and from about 40 to about 80 parts by weight of 3,4-epoxycyclohexylmethyl-3',4'-epoxycyclohexane carboxylate, dicyclopentadiene dioxide, or bis(3,4-epoxycyclohexyl) adipate. When the cationic polymerization initiator is a diaryliodonium salt, the catalyst solution preferably contains about 40 parts by weight of the diaryliodonium salt curing agent and about 60 parts by weight 3,4-epoxycyclohexylmethyl-3',4'-epoxycyclohexane carboxylate, dicyclopentadiene dioxide, or bis(3,4-epoxycyclohexyl) adipate.

Typically, from about 0.1 to about 5 parts by weight of the catalyst solution is added to an appropriate amount of siloxane epoxy polymer resin (ranging from about 95 to about 99.9 parts by weight siloxane epoxy polymer).

Preferred diaryliodonium salts include [4-(2-hydroxy-1-tetradecyloxy)-phenyl]phenyliodonium hexafluoroantimonate having formula (VI), wherein [A]⁻ is $[SbF_6]^-$, and $R^{12}$ is $C_{12}H_{25}$ (available from Polyset Company, as PC-2506); [4-(2-hydroxy-1-tetradecyloxy)-phenyl]phenyliodonium hexafluorophosphate, wherein in formula (VI), [A]⁻ is $[PF_6]^-$, and $R^{12}$ is $C_{12}H_{25}$ (available from Polyset Company as PC-2508); [4-(2-hydroxy-1-tetradecyloxy)-phenyl] 4-methylphenyliodonium hexafluoroantimonate (formula (VII)), wherein [A]⁻ is $[SbF_6]^-$, and $R^{12}$ is $C_{12}H_{25}$ (available from Polyset Company as PC-2509), and [4-(2-hydroxy-1-tetradecyloxy)-phenyl] 4-methylphenyliodonium hexafluorophosphate (formula (VII)) wherein [A]⁻ is $[PF_6]^-$, and $R^{12}$ is $C_{12}H_{25}$ (available from Polyset Company as PC-2519). The preparation of cationic initiators having formula (VII) is described in the aforementioned U.S. Pat. No. 6,632,960.

Depending on the thickness of the dielectric film, thermal curing is generally performed by heating the deposited polymer solution to a temperature ranging from about 155° C. to about 360° C., but preferably about 165° C., for a period of time ranging from about 0.5 to about 2 hours. In formulations curable by U.V. light, the films may be flood exposed by U.V. light (>300 mJ/cm² @ 250–380 nm). Curing by E-beam radiation is often done at a dosage ranging from about 3 to about 12 Mrad. Often a thermal bake will be used in combination with a cure by U.V. or E-beam radiation. E-beam curing is described in U.S. Pat. Nos. 5,260,349 and 4,654,379. The particular polymer formulation will determine which curing method will be used, as one of skill would know. Following curing, a thermal anneal may be employed under nitrogen or other inert gas at temperatures ranging from about 200° C. to about 300° C., but preferably about 250° C. for a period of time ranging from about 1 to about 3 hours, but preferably about 2 hours.

Furthermore, by changing the formula of the polymer, by varying its concentration, and the thickness of the deposited film, the onset curing temperature and the speed of cure can be adjusted within a wide latitude.

Typically, when the siloxane epoxy polymer films are thermally cured, the amount of catalyst can be decreased dramatically relative to the amount of photocatalyst needed to effect a cure induced by actinic radiation. For instance, in a thermal treatment, an exemplary siloxane epoxy resin composition contains about 0.1 wt. % cationic initiator (i.e. 0.1 parts by weight catalyst solution and about 99.9 parts by weight siloxane epoxy polymer, wherein an exemplary catalyst solution is a 40 wt. % solution of [4-(2-hydroxy-1-tetradecyloxy)-phenyl]phenyliodonium hexafluoroantimonate (Polyset PC-2506) dissolved in 3,4-epoxycyclohexylmethyl 3',4'-epoxycyclohexanecarboxylate (Union Carbide ERL-4221E)). By contrast, when the curing process is done by photo-irradiation, the amount of the catalyst is generally about 4 wt. % (i.e. 4 parts by weight catalyst solution and 96 parts polymer).

The following examples are given by way of illustration and are not intended to be limitative of the present invention. The reagents and other materials used in the examples are readily available materials, which can be conveniently prepared in accordance with conventional preparatory procedures or obtained from commercial sources.

EXAMPLE 1

N-type, 4-inch silicon wafers having a resistivity of 0–0.02 ohm-cm for MIM (Metal-Insulator-Metal) structures were used as the semiconductor substrates. After standard RCA cleaning an adhesion promoter (HMDS) was spin-coated onto each wafer at 3000 rpm for 40 sec. The wafers were then annealed in air at 100° C. for 10 min. A siloxane epoxy polymer solution containing formula (IIB), wherein the ratio of p to q was about 2:1, was spin-coated onto each wafer at 3000 rpm for 100 sec to a thickness of 0.5 µm. The polymeric film/wafers were dried under vacuum of $10^{-3}$ torr for 1 hour at 100° C. The polymer films were then cured at 165° C. under nitrogen gas flow for 2 hours to cross-link the polymer.

EXAMPLE 2

The procedure of Example 1 was followed. After curing, the polymer films were subjected to a thermal anneal at 250° C. under nitrogen gas flow for 2 hours.

The dielectric constants of the polymer films from Examples 1 and 2 were determined by measuring the capacitance of the polymer films (i.e., Metal-Insulator-Semiconductor (MIS) capacitor devices, Metal-Insulator-Metal (MIM) capacitor devices, and C-V techniques). The polymer was regularly shown to have a dielectric constant below 2.65. However, a dielectric constant as low as 2.2 has been measured for thinner films ranging from about 0.02 µm to about 0.09 µm.

EXAMPLE 3

Metal-Insulator-Semiconductor (MIS) capacitor structures were prepared from the samples of Example 1 by depositing a copper metal film directly onto the polymer layer of each sample prior to drying and curing. Copper served as an electrode in the structures. The copper metal thin films were deposited to a thickness of 0.3 µm using sputtering or e-beam evaporation. After drying and curing, as described in Example 1, the samples were then annealed at 250° C. under nitrogen gas for 1 hr.

Figure 1:
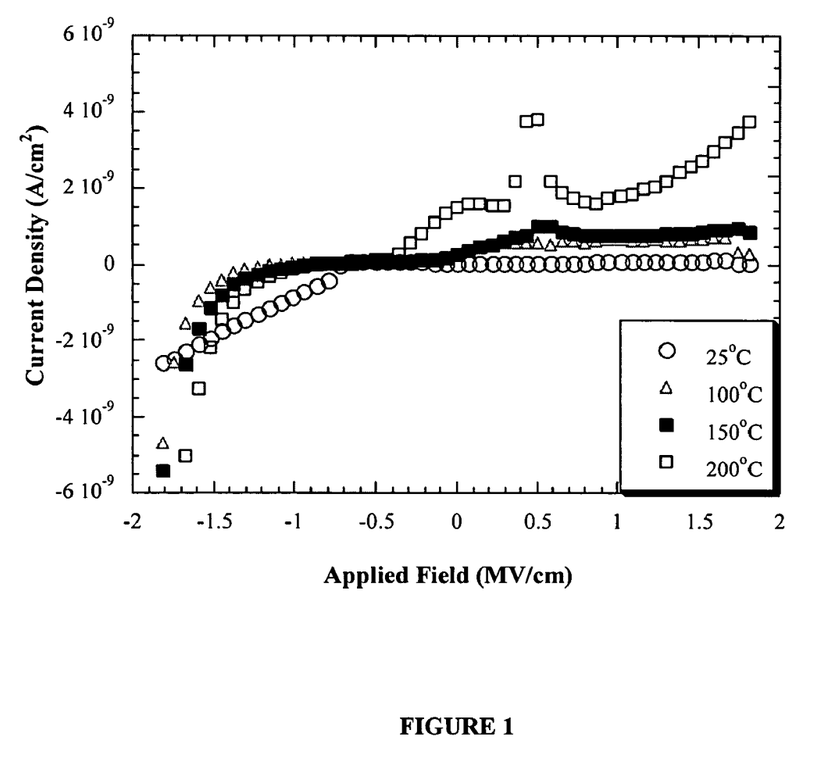
FIG. 1 is graph of current density vs. electric field (J vs. E) at various temperatures for an exemplary siloxane epoxy polymer dielectric embodiment of the present invention.

The electrical stability of the siloxane epoxy polymer (IIB) used in the capacitors of Example 3 was examined by doing I–V measurements on the films at 25° C. and higher temperatures. The measured current (I) was divided by the electrode area to get current density (J), and the voltage (V) was divided by the film thickness (0.5 µm) to get applied electrical field (E). The J ($A/cm^2$) vs. E (MV/cm) plot for the polymer is shown in FIG. 1 and indicates that the leakage current density through the dielectric at temperatures up to 150° C. is very similar to the one at room temperature. At 200° C. the siloxane epoxy dielectric shows a slightly higher current density, but is still in $10^{-9}$ $A/cm^2$ range for ±2 MV/cm applied electrical field.

Figure 2:
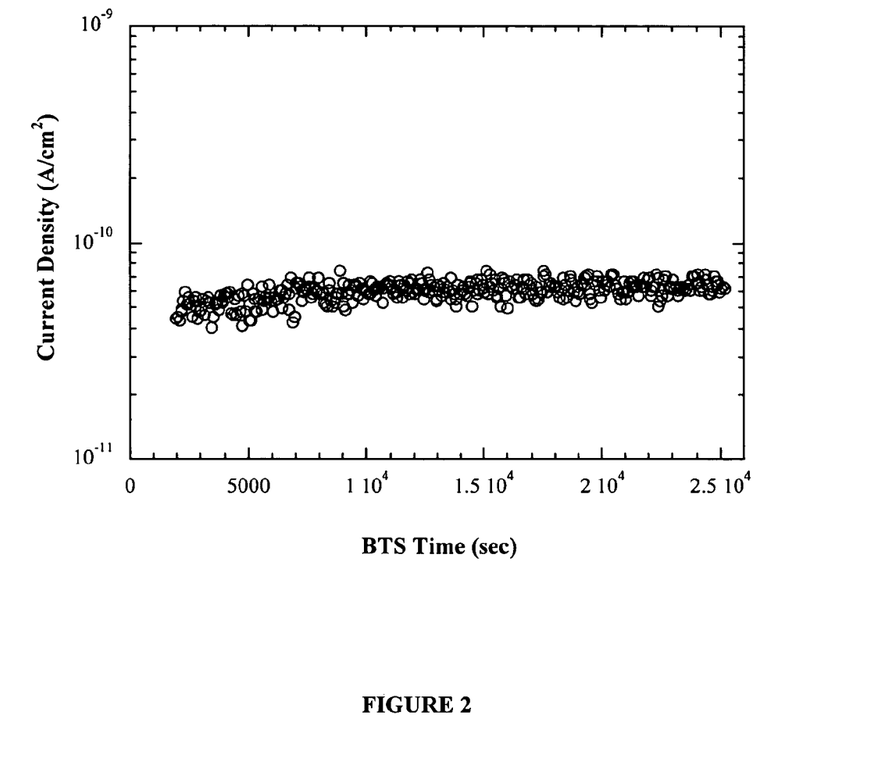
FIG. 2 is a graph of current density vs. time (J vs. t) for an exemplary siloxane epoxy polymer dielectric embodiment of the present invention, which indicates that the leakage current property does not degrade with time.

A second test was conducted on the samples of Example 3 to verify the electrical stability of the siloxane epoxy polymer film (IIB) used in the MIS capacitors. The test was I-t, whereby the current (converted to J in $A/cm^2$) is monitored with Bias Temperature Stress (BTS) time. The current density data for the siloxane epoxy dielectric with the BTS conditions of 1 MV/cm and a temperature of 150° C. is presented in FIG. 2. The graph indicates that the dielectric maintains a low leakage current density, in $10^{-11}$ $Å/cm^2$ range, at least for 7 hrs.

Figure 3:
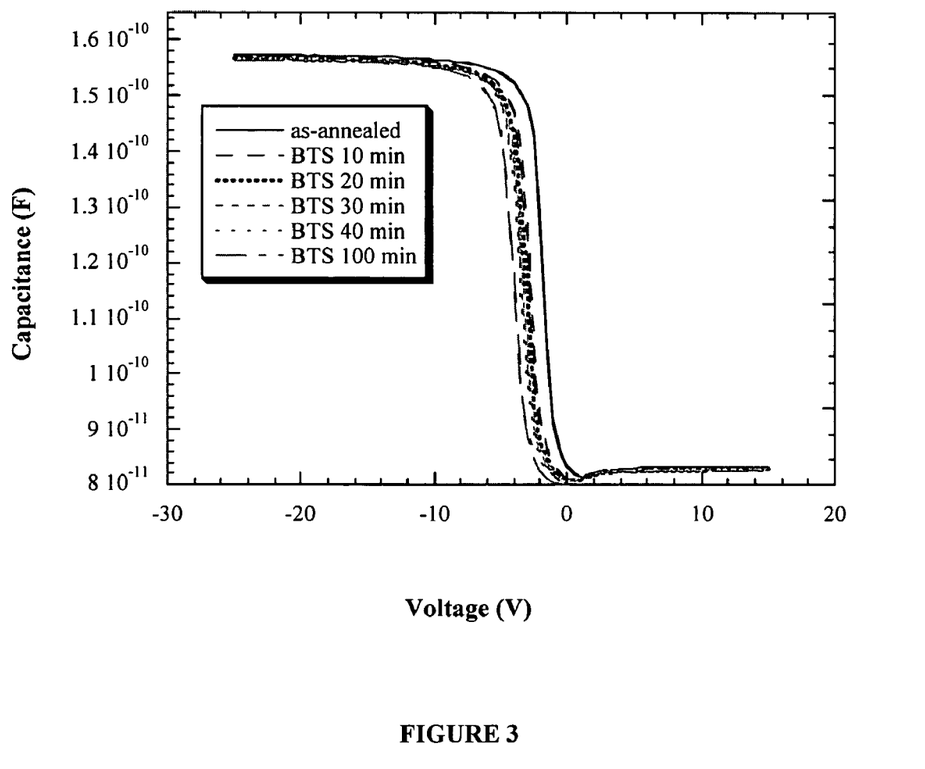
FIG. 3 is a graph of capacitance vs. voltage (C vs. V) for MIS capacitors comprising an exemplary siloxane epoxy polymer dielectric embodiment and an adjacent copper metal layer, wherein the capacitors were subjected to Bias Temperature Stress (BTS) conditions of 150° C. and 0.5 MV/cm for 10, 20, 30, 40, and 100 minutes in sequence.

FIG. 3 shows various C-V (capacitance vs. voltage) plots of the MIS capacitors of Example 3 that were subjected to Bias Temperature Stress (BTS) conditions at 150° C. and 0.5 MV/cm for 10, 20, 30, 40, and 100 minutes in sequence. The flat-band voltage shift of ~2 V was observed to the left after BTS for 10 min. No significant flat-band voltage shift was observed as the capacitor samples were subjected to further BTS treatments suggesting that the C-V curves reached the equilibrium state. Continuous Cu ion injection in a dielectric film would manifest itself by continuous shifting of the flat band voltage of C-V curves. Since the flat-band voltage shift observed was not significant, it can be interpreted that the Cu diffusion, if any, in the siloxane epoxy dielectric is negligible and harmless to the device.

Figure 4:
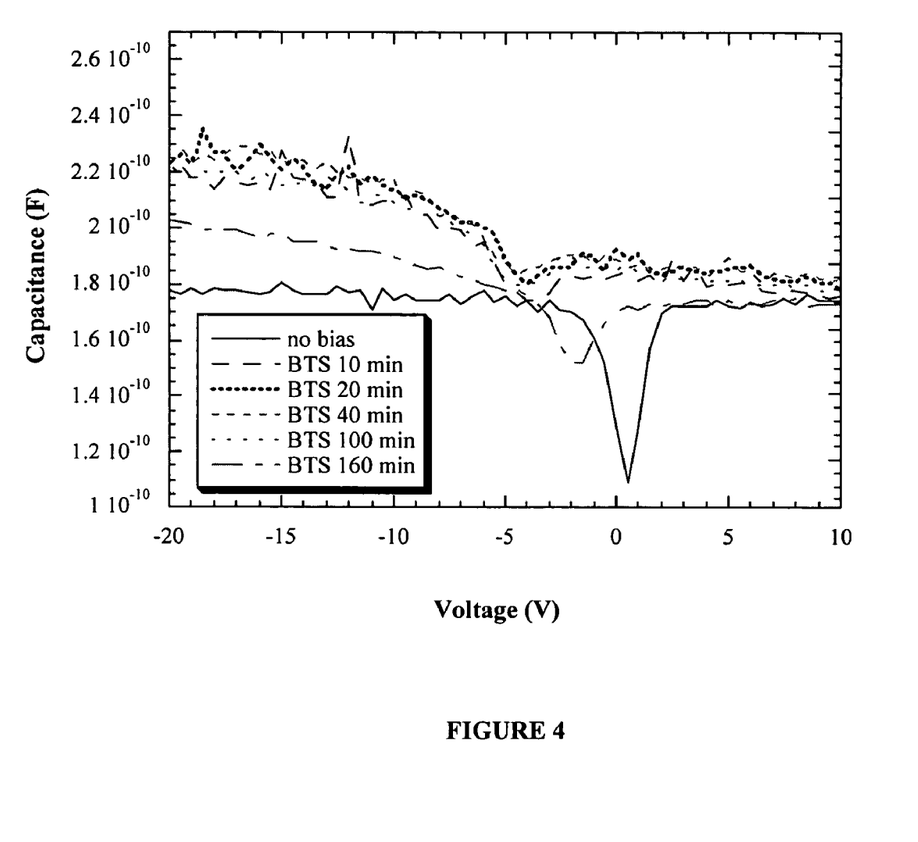
FIG. 4 is a graph of capacitance vs. voltage (C vs. V) representing the Triangular Voltage Sweep (TVS) data on MIS capacitors comprising an exemplary siloxane epoxy polymer dielectric embodiment and an adjacent copper metal layer wherein the capacitors were subjected to Bias Temperature Stress (BTS) conditions of 150° C. and 0.5 MV/cm for 10, 20, 30, 40, and 100 minutes separately.

FIG. 4 shows a plot (C vs. V) representing the Triangular Voltage Sweep (TVS) data of the MIS capacitor structures of Example 3 that were subjected to BTS conditions of 150° C. and 0.5 MV/cm for 10, 20, 30, 40, and 100 minutes separately. If there were any charge injection in the dielectric film, it would appear in the TVS curve as a peak centered at a negative voltage. The absence of a peak in the TVS curves indicates that there is no significant Cu diffusion in the dielectric at the BTS conditions mentioned.

EXAMPLE 4

Figure 5:
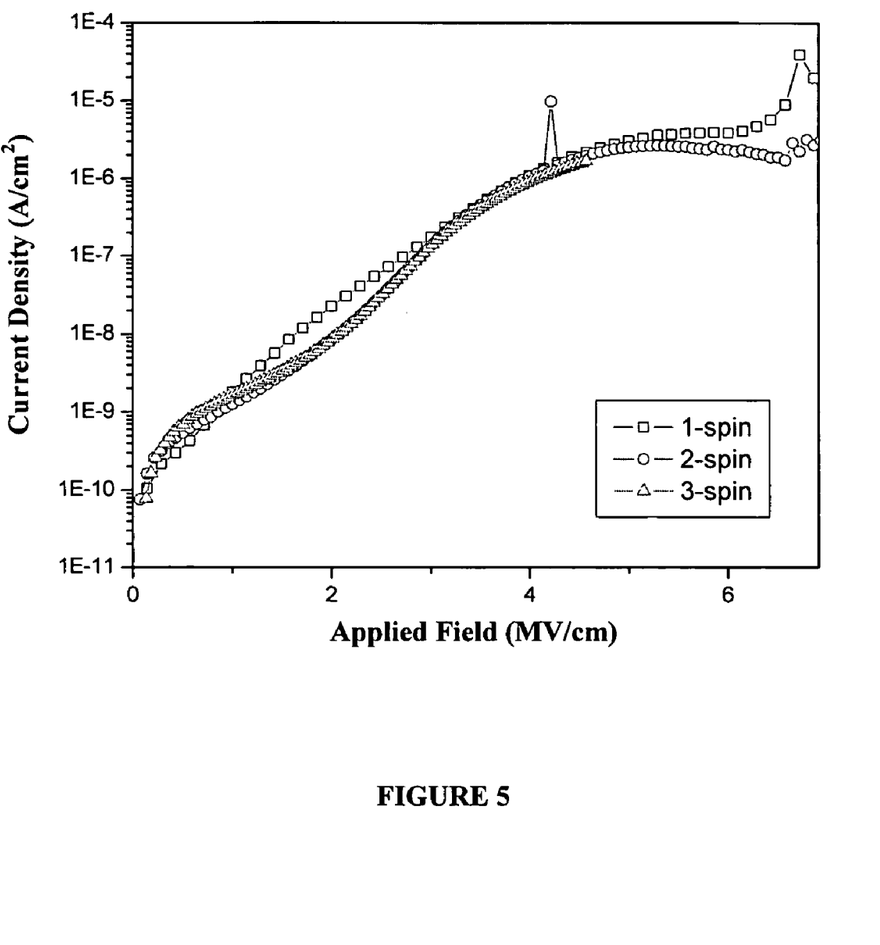
FIG. 5 is a graph of current density vs. electric field (J vs. E) for multiple layers of siloxane epoxy polymer dielectrics in accordance with the present invention.

The procedure of Example 1 was followed, followed by the deposition of multiple dielectric layers of the siloxane epoxy polymer having formula (IIB), wherein the ratio of p to q was about 2:1. More particularly, after the first dielectric layer was dried and cured, as described in Example 1, another dielectric layer comprising formula (IIB) was spin-coated onto it at 3000 rpm for 100 sec to a thickness of 0.5, followed by drying and curing, as described in Example 1. However, prior to deposition of each subsequent dielectric layer, the cured underlying dielectric polymer was subjected to a surface treatment, as described in the aforementioned related copending U.S. patent application Ser. No. 10/832, 629 filed Apr. 27, 2004 and entitled "CHEMICAL TREATMENT OF MATERIAL SURFACES", to promote wetting and adhesion of the subsequent polymeric dielectric layer. In particular, the surface of the cured polymeric dielectric was contacted with an aqueous solution of sulfuric acid (50% by weight) for 30 seconds at room temperature, followed by removal of the acid solution by rinsing with deionized water for 30 seconds at room temperature and drying. In this manner 1-spin, 2-spin and 3-spin films were processed. The entire structure was then subjected to a thermal anneal at 250° C. under nitrogen gas flow for 2 hours. The J vs. B plots for these films are shown in FIG. 5, which indicate that the leakage current densities in multiple spin dielectric films are very similar to that of the single spin dielectric. This suggests that the interface between different spins does not affect the electrical properties and the low leakage current can still be maintained for siloxane epoxy dielectrics even when deposited in layers. Thus, even when thick layers of siloxane epoxy polymers are deposited, the materials still retain their good electrical properties.

To summarize the results of the testing, the leakage current in the siloxane epoxy polymer dielectrics described herein was measured with varying electrical field, temperature, and time. When subjected to electrical fields of ±2 MV/cm and temperatures up to 200° C., the leakage current densities in the dielectrics were below $6 \times 10^{-9}$ A/cm$^2$. Furthermore, the leakage current density in the dielectrics was nearly a constant at $6 \times 10^{-11}$ A/cm$^2$ when the films were subjected to Bias Temperature Stress (BTS) conditions of 1 MV/cm and 150° C. for up to 7 hrs. Multiple-layer structures of the spin-on polymer were shown to have similar leakage current properties as the single-spin polymer. No significant Cu diffusion was seen in the films using BTS, C-V and TVS tests. All these properties make the siloxane epoxy polymers having formulae (I) and (II) excellent low-κ dielectric material choices for the semiconductor industry.

Figure 6:
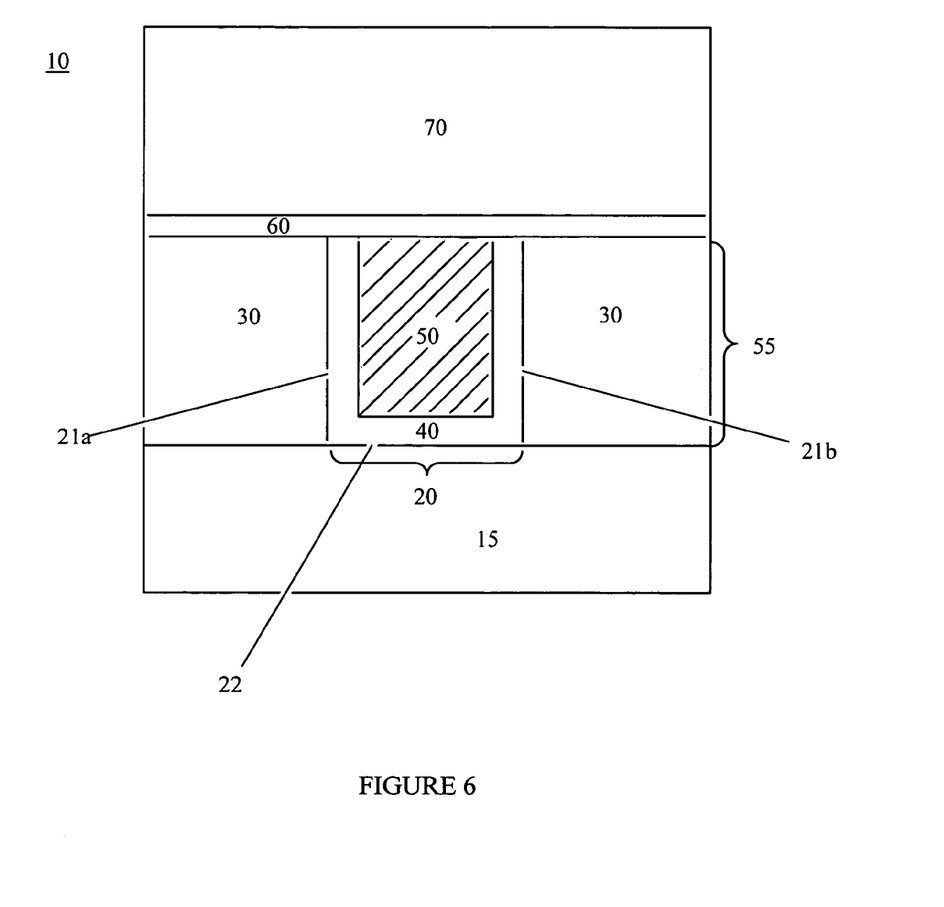
FIG. 6 is a cross-section of a portion of an embodiment of the present invention comprising a semiconductor metal interconnect device which includes at least one siloxane epoxy polymer as an interlayer dielectric.

FIG. 6 is a cross-sectional view of a portion 10 of an exemplary semiconductor device, which utilizes the low-κ siloxane epoxy polymers described herein as an interlayer dielectric. However, as one of skill would know the low-κ siloxane epoxy dielectrics can be applied in a multitude of other semiconductor devices. In this embodiment the device is a conventional semiconductor metal interconnect structure fabricated using damascene processing, wherein trenches (lines) (not shown) and a via (hole) 20 are etched into interlayer dielectric 30. Dielectric 30 is disposed to a thickness ranging from about 0.5 μm to about 0.8 μm atop a semiconductor substrate 15, as defined herein. Conductive metal 50 (typically, but not limited to copper) is disposed in via 20 and planarized to form metal layer 55. In this embodiment, Ta-based liner 40, made of tantalum, TaN, or TaSiN, is conformally deposited onto sidewalls 21a and 21b and bottom 22 of via 20 (and any trenches, not shown), prior to deposition of metal 50 and planarization. Optional barrier 60, traditionally made of SiN, SiC, SiCH, or SiCN, disposed to a thickness ranging from about 0.03 μm to about 0.05 μm atop metal 50 acts as a metal diffusion barrier, as well as an etch stop layer for subsequent patterning of second dielectric 70 disposed to a thickness of ranging from about 0.5 μm to about 0.8 μm onto barrier 60. At least one of dielectric 30 or 70 is a low-κ siloxane epoxy polymer having structure (I) or (II), as described herein. Barrier 60 may also be a siloxane epoxy polymer having structure (I) or (II), as fully described in the aforementioned related U.S. application Ser. No. 10/832,844 entitled "SILOXANE EPOXY POLYMERS AS METAL DIFFUSION BARRIERS TO REDUCE ELECTROMIGRATION".

Each of the patents and patent applications mentioned herein is hereby incorporated by reference in its entirety.

The invention has been described in detail with particular reference to preferred embodiments thereof, but it will be understood by those skilled in the art that variations and modifications can be effected within the spirit and scope of the invention.

We claim:

1. A semiconductor device comprising a semiconductor substrate, one or more metal layers or structures located on said substrate, and one or more dielectric films, wherein at least one dielectric film comprises a siloxane epoxy polymer selected from the group consisting of polymers having formulae (I) and (II)

wherein m is an integer ranging from 5 to 50;

wherein X and Y are monomer units randomly distributed or occurring together, $R^1$ and $R^2$ are each independently selected from the group of methyl, methoxy, ethyl, ethoxy, propyl, butyl, pentyl, octyl, and phenyl; $R^3$ is methyl or ethyl; p is an integer ranging from 2 to 50; and q is 0 or an integer ranging from 1 to 50.

2. The device of claim 1, wherein said siloxane epoxy polymer is a polymer having formula (II), wherein $R^3$ is methyl.

3. The device of claim 2, wherein, $R^1$ and $R^2$ are both methyl groups in structure (II), and the ratio of p to q ranges from about 8:1 to about 1:1.

4. The device of claim 3, wherein the ratio of p to q ranges from about 4:1 to about 2:1.

5. The device of claim 2, wherein $R^1$ is a methyl group, and $R^2$ is a propyl group in structure (II), and the ratio of p to q ranges from about 8:1 to about 1:1.

6. The device of claim 2, wherein $R^1$ and $R^2$ are both propyl groups in structure (II), and the ratio of p to q ranges from about 8:1 to about 1:1.

7. The device of claim 2, wherein $R^1$ is a methyl group, and $R^2$ is a pentyl group in structure (II), and the ratio of p to q ranges from about 8:1 to about 1:1.

8. The device of claim 2, wherein $R^1$ and $R^2$ are both pentyl groups in structure (II), and the ratio of p to q ranges from about 8:1 to about 1:1.

9. The device of claim 1, wherein said siloxane epoxy polymer is a polymer having formula (I).

10. The device of claim 1, wherein each said at least one dielectric film comprising said siloxane epoxy polymer has a thickness ranging from about 0.02 µm to about 2 µm.

11. The device of claim 1, wherein each said at least one dielectric film comprising said siloxane epoxy polymer has a thickness ranging from about from about 0.1 µm to about 0.7 µm.

12. The device of claim 1, wherein a cationic polymerization initiator is present with said siloxane epoxy polymer, and wherein said cationic polymerization initiator is selected from the group consisting of diazonium, sulfonium, phosphonium, and iodonium salts.

13. The device of claim 12, wherein said cationic polymerization initiator is an iodonium salt selected from the group consisting of diaryliodonium salts having formulae (III), (IV), (V), (VI), and (VII)

wherein each $R^{11}$ is independently hydrogen, $C_1$ to $C_{20}$ alkyl, $C_1$ to $C_{20}$ alkoxyl, $C_1$ to $C_{20}$ hydroxyalkoxyl, halogen, and nitro; $R^{12}$ is $C_1$ to $C_{30}$ alkyl or $C_1$ to $C_{30}$ cycloalkyl; y and z are each independently integers having a value of at least 5; and $[A]^-$ is a non-nucleophilic anion selected from the group consisting of $[BF_4]^-$, $[PF_6]^-$, $[AsF_6]^-$, $[SbF_6]^-$, $[B(C_6F_5)_4]^-$, and $[Ga(C_6F_5)_4]^-$.

14. The device of claim 13, wherein said selected cationic polymerization initiator is present in a catalyst solution comprising from about 20 to about 60 parts by weight of said selected cationic polymerization initiator and from about 40 to about 80 parts by weight of 3,4-epoxycyclohexylmethyl-3',4'-epoxycyclohexane carboxylate, dicyclopentadiene dioxide, or bis(3,4-epoxycyclohexyl) adipate.

* * * * *